(12) United States Patent
Sun

(10) Patent No.: US 11,508,794 B2
(45) Date of Patent: Nov. 22, 2022

(54) DISPLAY PANEL WITH LIGHT-EMITTING PORTIONS IN PIXEL DEFINITION LAYER AND MANUFACTURING METHOD THEREOF

(71) Applicant: Wuhan China Star Optoelectronics Semiconductor Display Technology Co., Ltd., Hubei (CN)

(72) Inventor: Jiajia Sun, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 149 days.

(21) Appl. No.: 16/973,574

(22) PCT Filed: Jun. 30, 2020

(86) PCT No.: PCT/CN2020/099433
§ 371 (c)(1),
(2) Date: Dec. 9, 2020

(87) PCT Pub. No.: WO2021/253500
PCT Pub. Date: Dec. 23, 2021

(65) Prior Publication Data
US 2022/0190049 A1    Jun. 16, 2022

(30) Foreign Application Priority Data
Jun. 17, 2020  (CN) .......................... 202010551710.9

(51) Int. Cl.
*H01L 27/32*    (2006.01)
*H01L 51/52*    (2006.01)
*H01L 51/56*    (2006.01)

(52) U.S. Cl.
CPC ........ *H01L 27/326* (2013.01); *H01L 27/3246* (2013.01); *H01L 51/5209* (2013.01);
(Continued)

(58) Field of Classification Search
CPC .............. H01L 27/326; H01L 27/3246; H01L 51/5209; H01L 51/56; H01L 2227/323; H01L 2251/5315
See application file for complete search history.

(56) References Cited

U.S. PATENT DOCUMENTS

2015/0145907 A1\* 5/2015 Ryu ...................... G09G 3/3233
345/697
2017/0278913 A1\* 9/2017 Zhang ................. H01L 27/3258
(Continued)

FOREIGN PATENT DOCUMENTS

CN    104716164       6/2015
CN    108962955 A  \* 12/2018    ............. H01L 27/32
(Continued)

*Primary Examiner* — Peter Bradford

(57) ABSTRACT

A display panel and a manufacturing method are provided, wherein the display panel includes an array substrate, a first anode layer, a pixel definition layer, a second anode layer, a light-emitting layer, and a cathode layer. The array substrate includes an array area. The first anode layer is disposed on the array area. The pixel definition layer disposed on the array area and the first anode layer includes a plurality of holes and a first area. The second anode layer is disposed on the first area. The light-emitting layer is disposed in the plurality of holes. The cathode layer is disposed on the pixel definition layer and the light-emitting layer.

17 Claims, 9 Drawing Sheets

(52) U.S. Cl.
CPC ........ *H01L 51/56* (2013.01); *H01L 2227/323* (2013.01); *H01L 2251/5315* (2013.01)

(56) References Cited

U.S. PATENT DOCUMENTS

| | | |
|---|---|---|
| 2019/0208044 A1 | 7/2019 | Lee et al. |
| 2022/0165980 A1* | 5/2022 | Shim ................... H01L 27/3276 |
| 2022/0208907 A1* | 6/2022 | Ryu .................... H01L 27/3276 |

FOREIGN PATENT DOCUMENTS

| | | | | |
|---|---|---|---|---|
| CN | 110061145 A | * | 7/2019 | ......... H01L 27/3276 |
| CN | 111146261 | | 5/2020 | |
| CN | 111900186 | | 11/2020 | |
| JP | 2012-160388 | | 8/2012 | |
| KR | 10-2010-0054351 | | 5/2010 | |
| KR | 20180003719 A | * | 1/2018 | |
| KR | 10-2019-0074859 | | 6/2019 | |

\* cited by examiner

DISPLAY PANEL WITH LIGHT-EMITTING PORTIONS IN PIXEL DEFINITION LAYER AND MANUFACTURING METHOD THEREOF

RELATED APPLICATIONS

This application is a National Phase of PCT Patent Application No. PCT/CN2020/099433 having International filing date of Jun. 30, 2020, which claims the benefit of priority of Chinese Patent Application No. 202010551710.9 filed on Jun. 17, 2020. The contents of the above applications are all incorporated by reference as if fully set forth herein in their entirety.

FIELD AND BACKGROUND OF THE INVENTION

The present disclosure relates to the field of display technology, and more particularly, to a display panel and a manufacturing method thereof.

At present, in display devices, a hole is usually designed in the display devices to dispose an under-screen camera. However, an area to dispose the under-screen camera needs to remove corresponding device film layer, so the area to dispose the under-screen camera cannot display normally.

SUMMARY OF THE INVENTION

The present disclosure provides a display panel and a manufacturing method thereof to solve a technical problem that an area configured to dispose an under-screen camera cannot display and image normally in the prior art.

The present disclosure provides a display panel, including:

an array substrate including an array area and a vacancy area, and including a substrate and a buffer layer disposed on the substrate;

a first anode layer disposed on the array area and electrically connected to the array substrate;

a pixel definition layer disposed on the array area of the array substrate and the first anode layer, and including a plurality of holes penetrating the pixel definition layer to expose the first anode layer and a first area disposed on a side of the vacancy area;

a second anode layer disposed on the first area of the pixel definition layer, and the pixel definition layer in the plurality of holes of the second anode layer is facing to a surface of the vacancy area, wherein the first anode layer and the second anode layer are insulated from each other;

a light-emitting layer including a plurality of light-emitting portions, wherein each of the plurality of light-emitting portions is disposed in one of the plurality of holes, and the plurality of light-emitting portions cover and electrically connect the first anode layer and the second anode layer; and a cathode layer disposed on the pixel definition layer and the light-emitting layer, and electrically connected to the light-emitting layer.

In the display panel provided by the present disclosure, the second anode layer includes a plurality of second anodes, wherein each of the plurality of second anodes includes an extension portion disposed on an upper surface of the pixel definition layer, and an insulation layer is disposed between the extension portion and the cathode layer.

In the display panel provided by the present disclosure, the first area surrounds the vacancy area.

In the display panel provided by the present disclosure, the array substrate includes a plurality of first transistors electrically connected to the first anode layer, and a plurality of second transistors electrically connected to the second anode layer.

In the display panel provided by the present disclosure, the pixel definition layer further includes a second area, wherein the first area is disposed between the second area and the vacancy area, and the light-emitting layer further includes a plurality of second light-emitting portions, wherein each of the plurality of second light-emitting portions is disposed in one of the plurality of holes of the first area, and the plurality of second light-emitting portions electrically connect the first anode layer and the cathode layer.

In the display panel provided by the present disclosure, the plurality of first light-emitting portions cover the second anode layer, and light emitted by the plurality of first light-emitting portions is emitted from the vacancy area, wherein the plurality of second light-emitting portions cover the first anode layer, and light emitted by the plurality of second light-emitting portions is emitted from the array area.

In the display panel provided by the present disclosure, the display panel further includes an encapsulation layer disposed on the cathode layer of the array area and the vacancy area.

The present disclosure further provides a display panel, including: an array substrate including an array area and a vacancy area;

a first anode layer disposed on the array area and electrically connected to the array substrate;

a pixel definition layer disposed on the array area of the array substrate and the first anode layer, and including a plurality of holes penetrating the pixel definition layer to expose the first anode layer and a first area disposed on a side of the vacancy area;

a second anode layer disposed on the first area of the pixel definition layer, and the pixel definition layer in the plurality of holes of the second anode layer is facing to a surface of the vacancy area, wherein the first anode layer and the second anode layer are insulated from each other;

a light-emitting layer including a plurality of light-emitting portions, wherein each of the plurality of light-emitting portions is disposed in one of the plurality of holes, and the plurality of light-emitting portions cover and electrically connect the first anode layer and the second anode layer; and a cathode layer disposed on the pixel definition layer and the light-emitting layer, and electrically connected to the light-emitting layer.

In the display panel provided by the present disclosure, the second anode layer includes a plurality of second anodes, wherein each of the plurality of second anodes includes an extension portion disposed on an upper surface of the pixel definition layer, and an insulation layer is disposed between the extension portion and the cathode layer.

In the display panel provided by the present disclosure, the first area surrounds the vacancy area.

In the display panel provided by the present disclosure, the array substrate includes a plurality of first transistors electrically connected to the first anode layer, and a plurality of second transistors electrically connected to the second anode layer.

In the display panel provided by the present disclosure, the pixel definition layer further includes a second area, wherein the first area is disposed between the second area and the vacancy area, and the light-emitting layer further includes a plurality of second light-emitting portions, wherein each of the plurality of second light-emitting portions is disposed in one of the plurality of holes of the first area, and the plurality of second light-emitting portions electrically connect the first anode layer and the cathode layer.

In the display panel provided by the present disclosure, the plurality of first light-emitting portions cover the second anode layer, and light emitted by the plurality of first light-emitting portions is emitted from the vacancy area, wherein the plurality of second light-emitting portions cover the first anode layer, and light emitted by the plurality of second light-emitting portions is emitted from the array area.

In the display panel provided by the present disclosure, the display panel further includes an encapsulation layer disposed on the cathode layer of the array area and the vacancy area.

The present disclosure further provides a manufacturing method of the display panel, including:

providing an array substrate including an array area and a vacancy area;

disposing a first anode layer on the array area of the array substrate, wherein the first anode layer is electrically connected to the array substrate;

disposing a pixel definition layer on the array area of the array substrate and the first anode layer, wherein the pixel definition layer includes a plurality of holes penetrating the pixel definition layer to expose the first anode layer and a first area disposed on a side of the vacancy area;

disposing a second anode layer on the first area of the pixel definition layer, and the pixel definition layer in the plurality of holes of the second anode layer is facing to a surface of the vacancy area, wherein the first anode layer and the second anode layer are insulated from each other;

disposing a light-emitting layer including a plurality of light-emitting portions in the plurality of holes, wherein each of the plurality of light-emitting portions is disposed in one of the plurality of holes, and the plurality of light-emitting portions cover and electrically connect the first anode layer and the second anode layer; and disposing a cathode layer on the pixel definition layer and the light-emitting layer, wherein the cathode layer is electrically connected to the light-emitting layer.

In the display panel provided by the present disclosure, after the step of disposing the cathode layer on the pixel definition layer and the light-emitting layer, wherein the cathode layer is electrically connected to the light-emitting layer, further includes:

disposing an encapsulation layer on the cathode layer of the array area and the vacancy area.

In the display panel provided by the present disclosure, after the step of disposing the second anode layer on the first area of the pixel definition layer, and the pixel definition layer in the plurality of holes of the second anode layer is facing to the surface of the vacancy area, wherein the first anode layer and the second anode layer are insulated from each other further includes:

disposing an insulation layer on the second anode layer, wherein the second anode layer includes a plurality of second anodes, and each of the plurality of second anodes includes an extension portion disposed on an upper surface of the pixel definition layer, and the insulation layer covers the extension portion.

The present disclosure provides the display panel and the manufacturing method thereof. The display panel includes the array substrate, the first anode layer, the pixel definition layer, the second anode layer, the light-emitting layer, and the cathode layer. The array substrate includes the array area and the vacancy area. The first anode layer is disposed on the array area and electrically connected to the array substrate. The pixel definition layer is disposed on the array area of the array substrate and the first anode layer, and includes the plurality of holes penetrating the pixel definition layer to expose the first anode layer and a first area disposed on a side of the vacancy area. The second anode layer is disposed on the first area of the pixel definition layer, and the pixel definition layer in the plurality of holes of the second anode layer is facing to a surface of the vacancy area, wherein the first anode layer and the second anode layer are insulated from each other. The light-emitting layer includes the plurality of light-emitting portions, wherein each of the plurality of light-emitting portions is disposed in one of the plurality of holes, and the plurality of light-emitting portions cover and electrically connect the first anode layer and the second anode layer. The cathode layer is disposed on the pixel definition layer and the light-emitting layer, and electrically connected to the light-emitting layer. In the present disclosure, the first light-emitting portion emits the light sideways to the vacancy area by connecting the first light-emitting portion with the second anode layer, which allows the vacancy area to image normally and display normally.

BRIEF DESCRIPTION OF THE SEVERAL VIEWS OF THE DRAWINGS

In order to more clearly explain the technical solutions provided by embodiments of the invention, a brief description of the drawings used for describing these embodiments is given below. Apparently, the drawings in the following description are only for certain illustrative embodiments of the invention, and for those ordinarily skilled in this field, other drawings can be obtained without creative labor based on the following drawings.

DESCRIPTION OF SPECIFIC EMBODIMENTS OF THE INVENTION

A clear and complete description of the technical solutions provided by embodiments of the present disclosure is given below with reference to the accompanying drawings. Apparently, the embodiments described below are only certain illustrative ones, but do not include all possible embodiments of the present disclosure. All other embodiments obtained by those ordinarily skilled in this field based on these illustrative embodiments without creative work should also fall within the protection scope of the present disclosure.

Figure 1:
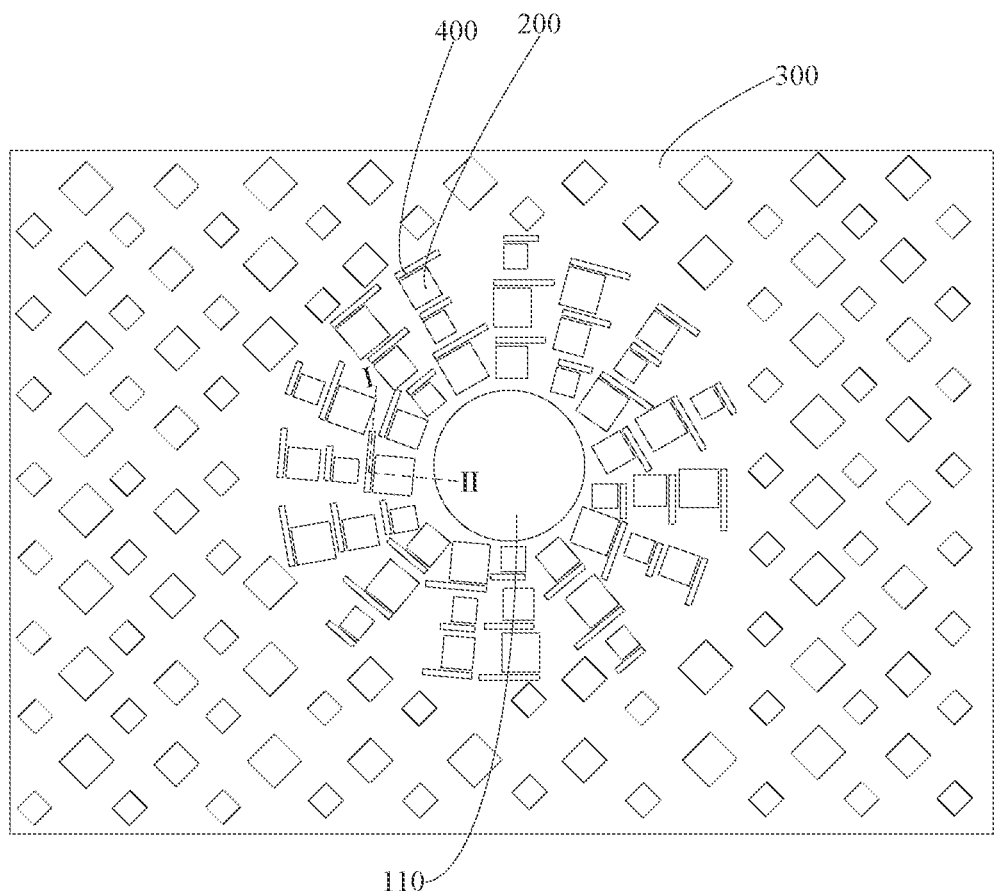
FIG. 1 is a first plan diagram of an anode layer provided by the present disclosure.
Figure 2:
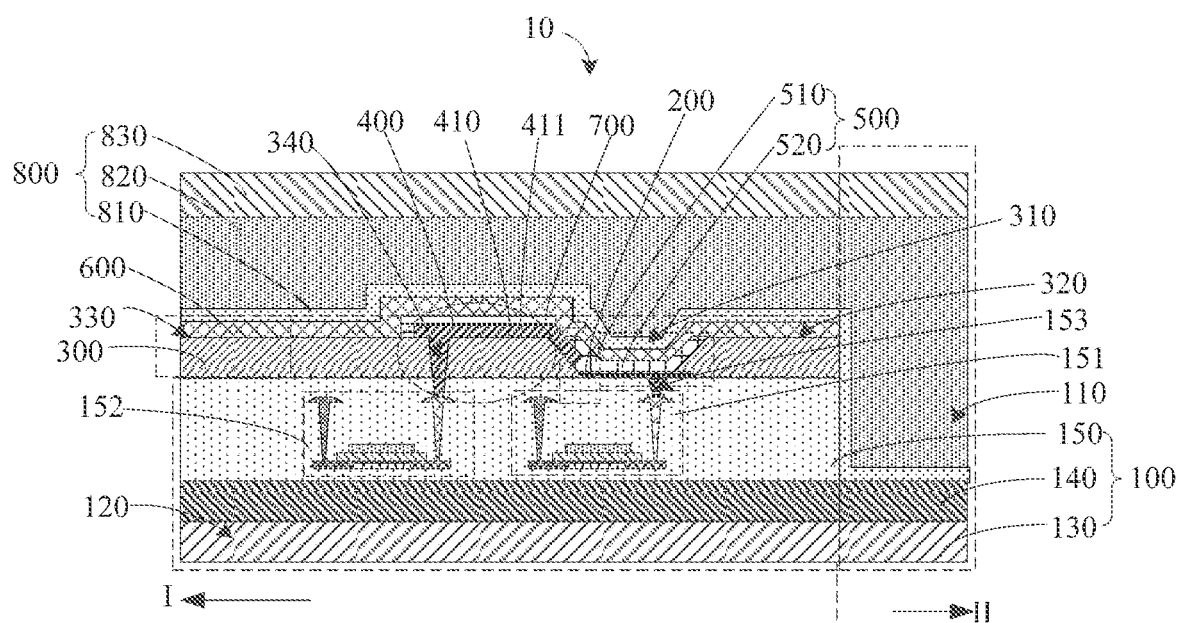
FIG. 2 is a cross-sectional diagram of a display panel along a line from I to II provided by the present disclosure.

Please refer to FIG. 1 and FIG. 2, FIG. 1 is a first plan view of an anode layer according to the present disclosure. FIG. 2 is a cross-sectional view of a display panel along a line from I to II provided by the present disclosure. The present disclosure provides a display panel 10. The display panel 10 includes an array substrate 100, a first anode layer 200, a pixel definition layer 300, a second anode layer 400, a light-emitting layer 500, and a cathode layer 600.

The array substrate 100 includes a vacancy area 110 and an array area 120. Specifically, the vacancy area 110 is configured to dispose an under-screen camera. The array substrate 100 includes a substrate 130, a buffer layer 140, and a transistor diode layer 150 disposed on the array area 120. The buffer layer 140 is disposed on the substrate 130. The buffer layer 140 is configured to block erosion from water and oxygen. The transistor diode layer 150 is disposed on the buffer layer 140 of the array area 120. The transistor diode layer 150 includes a plurality of first transistor diodes 151, and a plurality of second transistor diodes 152. The first transistor diode 151 includes a first source layer 1511, a first gate insulation layer 1512, a first gate electrode 1513, a first source electrode 1514, and a first drain electrode 1515. The first source layer 1511 includes an N-type doped portion 15111, a semiconductor portion 15112, and a P-type doped portion 15113. The N-type doped portion 15111 and the P-type doped portion 15113 are disposed on two sides of the semiconductor portion 15112. The first gate insulation layer 1512 is disposed on the first source layer 1511. The first gate electrode 1513 is disposed on the first gate insulation layer 1512. The first source electrode 1514 is disposed on a side of the first source layer 1511, and is electrically connected to the first source layer 1511. The drain electrode 1515 is disposed on another side of the first source layer 1511, and is electrically connected to the first source layer 1511. The second transistor diode 152 includes a second source layer 1521, a second gate insulation layer 1522, a second gate electrode 1523, a second source electrode 1524, and a second drain electrode 1525. Structures and corresponding positions of the second transistor diode 152 are the same as those of the first transistor diode 151, and it is not be repeated here. The transistor layer 150 further includes a plurality of first grooves 153. The first groove 153 is disposed on the first drain electrode 1515 and exposes the first drain electrode 1515.

The first anode layer 200 is disposed on the array layer 120. The first anode layer 200 is electrically connected to the array substrate 100. Specifically, the first anode layer 200 is disposed on the first groove 153 and the transistor diode layer 150. The first anode layer 200 is electrically connected to the first drain electrode 1515.

The pixel definition layer 300 is disposed on the array area 120 of the array substrate 100 and the first anode layer 200. The pixel definition layer 300 includes a plurality of holes 310. The hole 310 penetrates the pixel definition layer 300 to expose the first anode layer 200. The pixel definition layer 300 includes a first area 320 and a second area 330. The hole 310 is disposed in the first area 320. The first area 320 is disposed on a side of the vacancy area 110. The first area 320 is disposed between the second area 330 and the vacancy area 110. In the present disclosure, the first area 320 surrounds the vacancy area 110.

In another disclosure, the pixel definition layer 300 further includes a plurality of via holes 340. The via hole 340 is disposed in the first area, and penetrates the pixel definition layer 300 and part of the transistor diode layer 150 to expose the second drain electrode 1525.

The second anode layer 400 is disposed on the first area 320 of the pixel definition layer 300. The second anode layer 400 in the hole 310 is disposed on a surface of the pixel definition layer 300 facing the vacancy area. The first anode layer 200 and the second anode layer 400 are insulated from each other. Specifically, the second anode layer 400 includes a plurality of first anodes 410. Each of the plurality of first anodes 410 includes an extension portion 411. The extension portion 411 is disposed on an upper surface of the pixel definition layer 300, and disposed in the via hole 340. The first anode 410 is electrically connected to the second drain electrode 1525 by the extension portion 411.

In the present disclosure, a first anode layer and a second anode layer are insulated from each other to ensure that light-emitting portions driven by each do not interfere with each other when emitting light, thereby ensuring normal display of the display panel.

In another disclosure, the display panel 10 further includes an insulation layer 700. The insulation layer 700 is disposed on the extension portion 411, and covers the extension portion 411.

Figure 3:
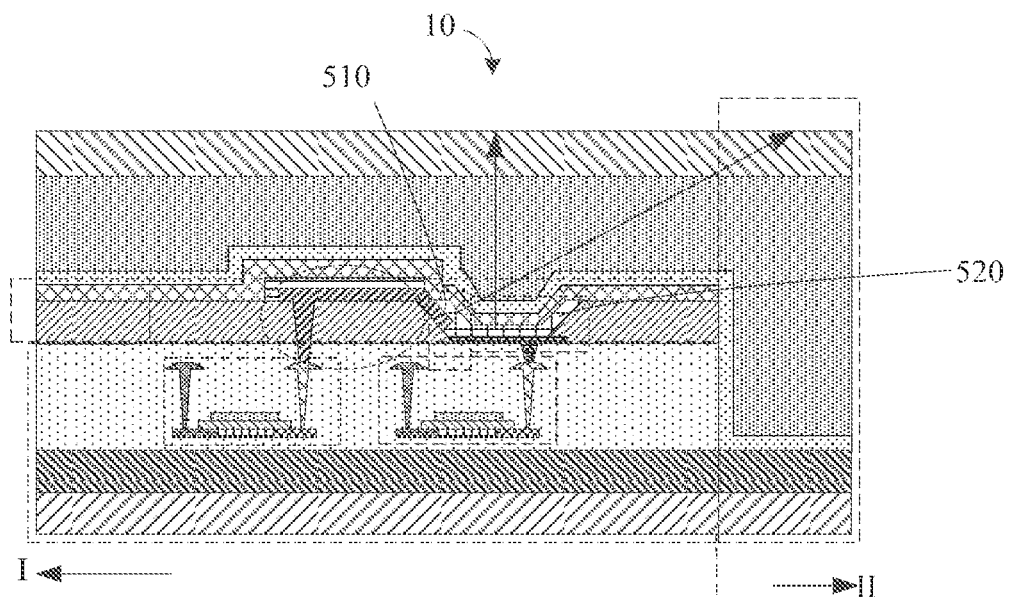
FIG. 3 is an optical path diagram of the display panel provided by the present disclosure.

Please refer to FIG. 3, FIG. 3 is an optical path diagram of the display panel provided by the present disclosure. The light-emitting layer 500 includes a plurality of first light-emitting portions 510 and a plurality of second light-emitting portions 520. Each of the plurality of first light-emitting portions 510 is disposed in a corresponding hole 230. The first light-emitting portion 510 is electrically connected to the first anode layer 200 and the second anode layer 500. The first light-emitting portion 510 is disposed on the second anode layer 400. Light emitted by the first light-emitting portion 510 is emitted from the vacancy area 110. The light emitted by the first light-emitting portion 510 is emitted sideways. Each of the plurality of second light-emitting portions 520 is disposed in a hole 230 of the first area 320, and the second light-emitting portion 520 covers and is electrically connected to the first anode layer 200. Light emitted by the second light-emitting portion 520 is emitted from the array area 120. The light emitted by the second light-emitting portion 520 is vertically emitted light. The first light-emitting portion 510 is electrically connected to the second light-emitting portion 520. The first light-emitting portion 510 and the second light-emitting portion 520 include a red light-emitting portion, a green light-emitting portion, and a blue light-emitting portion.

The cathode layer 600 is disposed on the pixel definition layer 300, the insulation layer 700, and the light-emitting layer 500. The cathode layer 600 is electrically connected to the light-emitting layer 500.

In the present disclosure, the second light-emitting portion is electrically connected to the first anode layer and the cathode layer. The first transistors drive the second light-emitting portions. Light emitted by the second light-emitting portion is vertically emitted light, and configured to provide normal display of an area surrounding the vacancy area. The first light-emitting portion is electrically connected to the second anode layer and the cathode layer. The second transistor is electrically connected to the second anode layer. The second transistor drives the first light-emitting portion. The first light-emitting portion emits light sideways to provide the light required for imaging of the under-screen camera disposed in the vacancy area, and to allow the vacancy area to display normally. At the same time, it further ensures that the under-screen camera can capture enough external light for normal imaging, because a functional film layer of the vacancy area is removed.

In another embodiment, the display panel 10 further includes an encapsulation layer 800. The encapsulation layer 800 is disposed on the cathode layer 600 of the array area 120 and the vacancy area 110. The encapsulation layer 800 is disposed on the array substrate 100 and the cathode 600 of the array area 120. The encapsulation layer 800 includes a first inorganic layer 810, an organic layer 820, and a second inorganic layer 830. The organic layer 820 is disposed on the first inorganic layer 810. The second inorganic layer 830 is disposed on the organic layer 820. In the present embodiment, the encapsulation layer 800 is a three-layer laminated structure.

Figure 4:
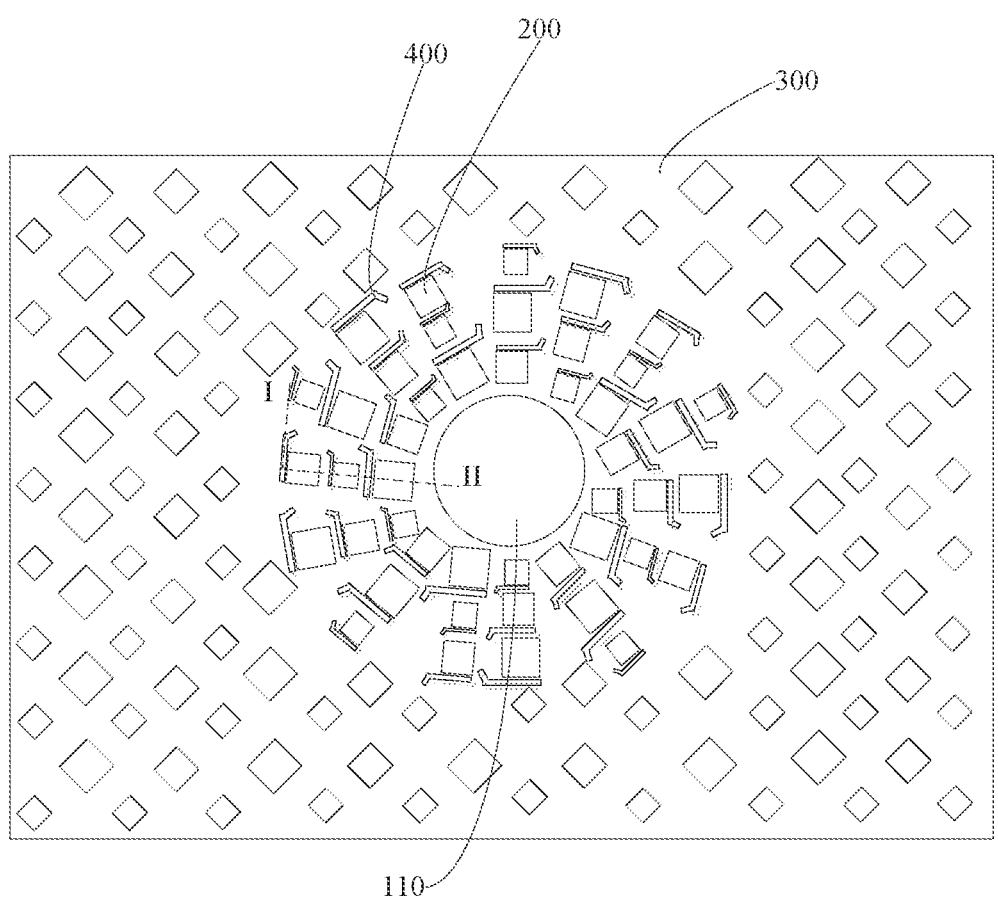
FIG. 4 is a second plan diagram of the anode layer provided by the present disclosure.

Please refer to FIG. 4, FIG. 4 is a second plan view of the anode layer according to the present disclosure. A difference between FIG. 4 and FIG. 1 is that the second anode layer 400 in FIG. 4 is non-linear design.

The present disclosure provides a display panel. The display panel includes an array substrate, a first anode layer, a pixel definition layer, a second anode layer, a light-emitting layer, and a cathode layer. The array substrate includes an array area and a vacancy area. The first anode layer is disposed on the array area. The first anode layer is electrically connected to the array substrate. The pixel definition layer is disposed on the array area of the array substrate and the first anode layer. The pixel definition layer includes a plurality of holes penetrating the pixel definition layer to expose the first anode layer. The pixel definition layer includes a first area disposed on a side of the vacancy area. The second anode layer is disposed on the first area of the pixel definition layer. The second anode layer in the plurality of holes is disposed on a surface of the pixel definition layer facing the vacancy area. The first anode layer and the second anode layer are insulated from each other. The light-emitting layer includes a plurality of first light-emitting portion, and each of the plurality of first light-emitting portions is disposed on one of the plurality of holes. The first light-emitting portion covers and is electrically connected to the first anode layer and the second anode layer. The cathode layer is disposed on the first pixel definition layer and the light-emitting layer, and is electrically connected to the light-emitting layer. In the present disclosure, the first light-emitting portion emits the light sideways to the vacancy area by connecting the first light-emitting portion with the second anode layer, which allows the vacancy area to image normally and display normally.

Figure 5:
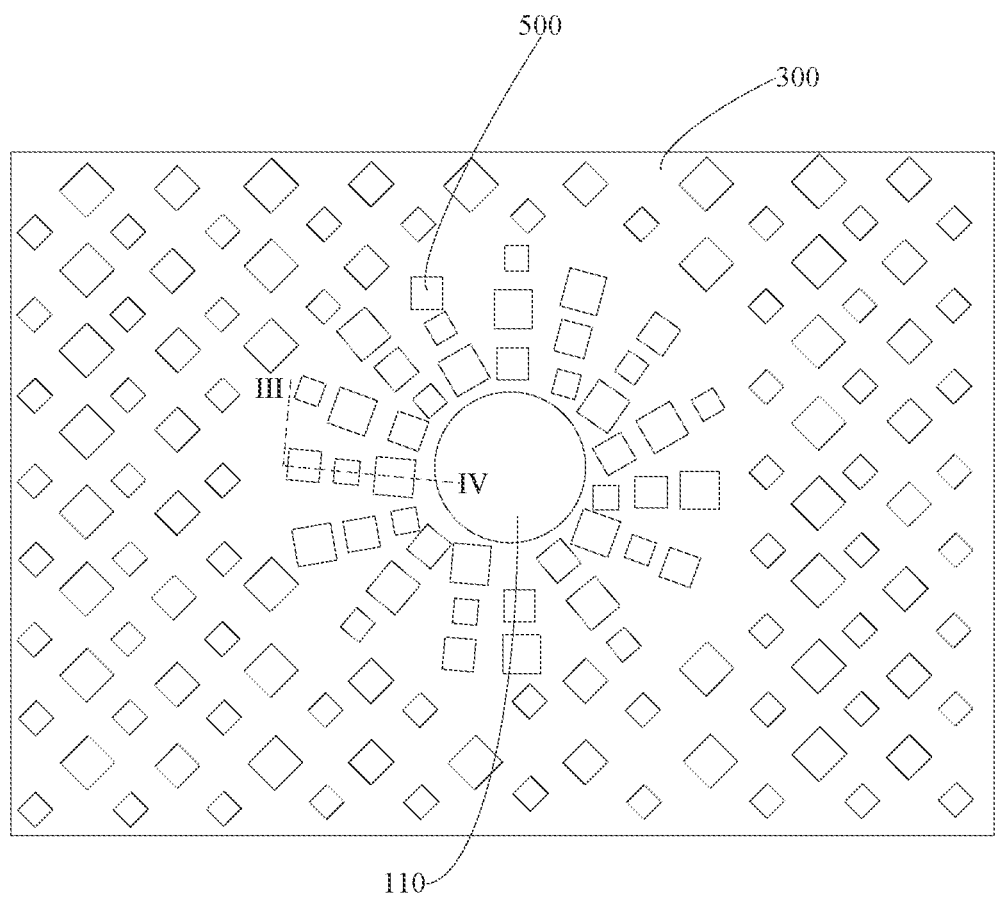
FIG. 5 is a pixel plan diagram of the display panel provided by the present disclosure.
Figure 6:
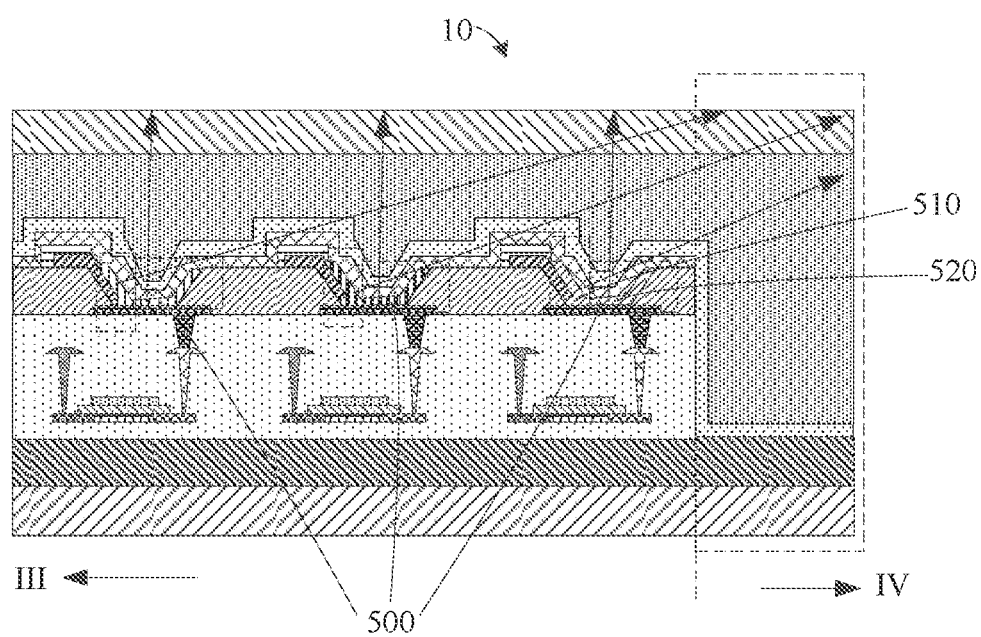
FIG. 6 is a cross-sectional diagram of the display panel along a line from III to IV provided by the present disclosure.
Figure 7:
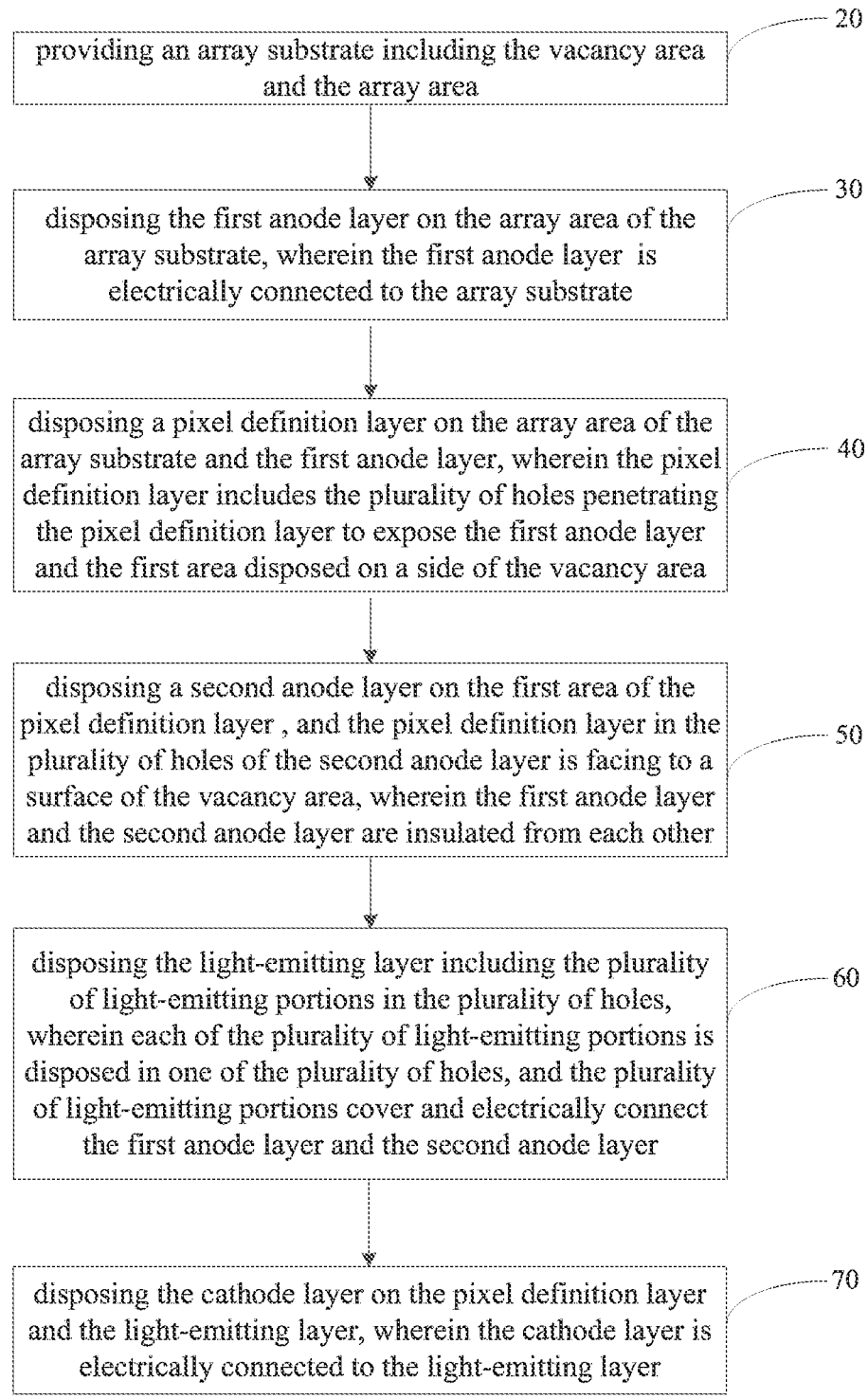
FIG. 7 is a flow diagram of a manufacturing method of the display panel provided by the present disclosure.

Please refer to FIG. 5 and FIG. 6, FIG. 5 is a plan view of a pixel of the display panel according to the present disclosure. FIG. 6 is a cross-sectional view of the display panel along a line III-IV according to the present disclosure.

It should be noted that FIG. 5 shows a distribution of a pixel layer disposed in and around the vacancy area according to the present disclosure. FIG. 6 only shows an optical path diagram of the first transistor driving the second light-emitting portion to allow for easy understanding, which does not mean that there is no second transistor driving the first light-emitting portion.

Please refer to FIG. 7, and FIG. 8 to FIG. 16, FIG. 7 is a flow diagram of a manufacturing method of the display panel provided by the present disclosure. FIG. 8 to FIG. 16 are flow cross-sectional diagrams of the manufacturing method of the display panel provided by the present disclosure. The present disclosure further provides the manufacturing method of the display panel 10, and the method includes:

20, providing an array substrate 100 including the vacancy area 110 and the array area 120.

Figure 8:
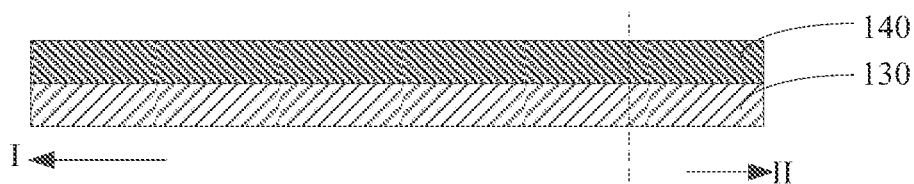
FIG. 8 to FIG. 16 are flow cross-sectional diagrams of the manufacturing method of the display panel provided by the present disclosure.
Figure 9:
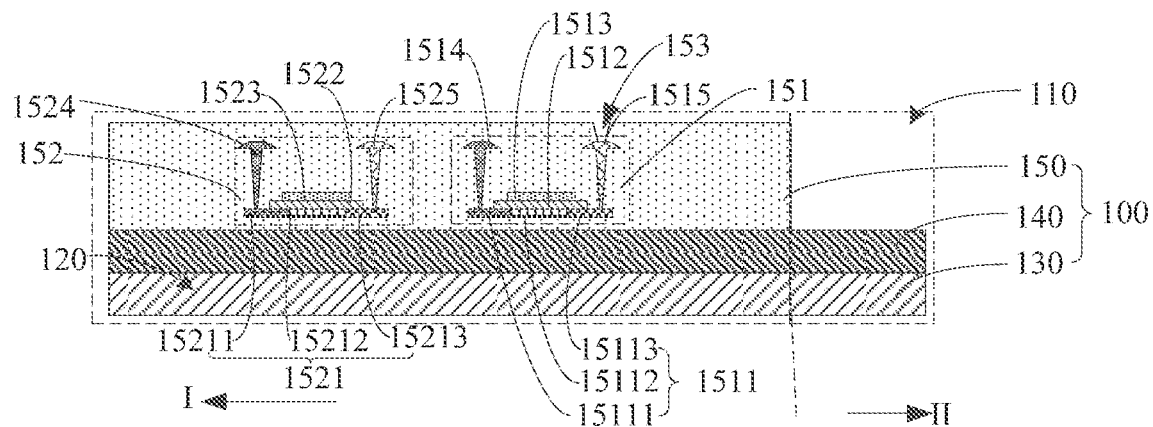

Please refer to FIG. 8 and FIG. 9, specifically, the vacancy area is configured to dispose the under-screen camera. The array substrate 100 includes the substrate 130, the buffer layer 140, and the transistor diode layer 150. The buffer layer 140 is formed on the substrate 130. The buffer layer 140 is configured to block the erosion from water and oxygen. The transistor diode layer 150 is formed on the buffer layer 140. The transistor diode layer 150 on the vacancy area 110 is removed by photomasking or etching. The transistor diode layer 150 includes the plurality of first transistor diodes 151 and the plurality of second transistor diodes 152. The first transistor diode 151 includes the first source layer 1511, the first gate insulation layer 1512, the first gate electrode 1513, the first source electrode 1514, and the first drain electrode 1515. The first source layer 1511 includes the N-type doped portion 15111, the semiconductor portion 15112, and the P-type doped portion 15113. The N-type doped portion 15111 and the P-type doped portion 15113 are disposed on two sides of the semiconductor portion 15112. The first gate insulation layer 1512 is disposed on the first source layer 1511. The first gate electrode 1513 is disposed on the first gate insulation layer 1512. The first source electrode 1514 is disposed on a side of the first source layer 1511, and is electrically connected to the first source layer 1511. The drain electrode 1515 is disposed on another side of the first source layer 1511, and is electrically connected to the first source layer 1511. The second transistor diode 152 includes a second source layer 1521, a second gate insulation layer 1522, a second gate electrode 1523, a second source electrode 1524, and a second drain electrode 1525. Structures and corresponding positions of the second transistor diode 152 are the same as those of the first transistor diode 151, and it is not be repeated here. The transistor layer 150 further includes the plurality of first grooves 153. The first groove 153 is disposed on the first drain electrode 1515 and exposes the first drain electrode 1515.

30, disposing the first anode layer 200 on the array area 120 of the array substrate 100, wherein the first anode layer 200 is electrically connected to the array substrate 100.

Figure 10:
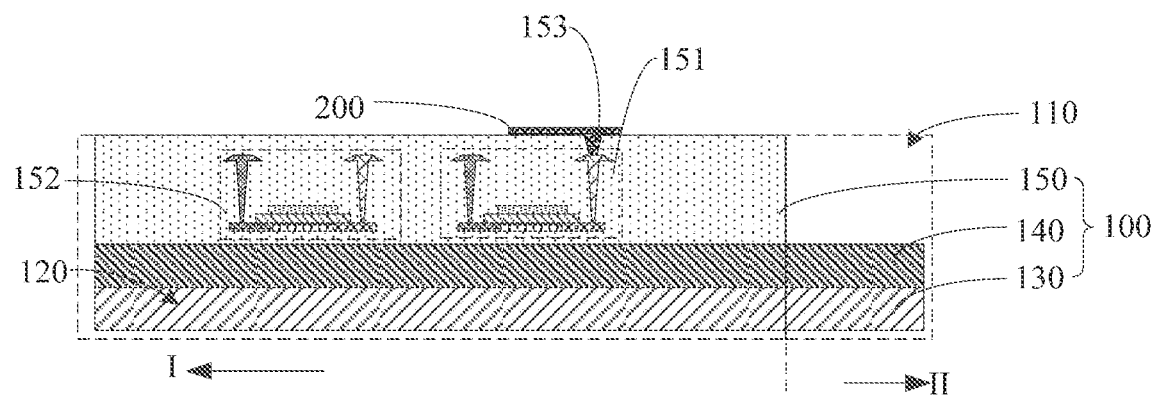

Please refer to FIG. 10, the first anode layer material is disposed on the first groove 153 and the transistor diode layer 150 to form the first anode layer 200 by a photomasking or an etching method. The first anode layer 200 is electrically connected to the first drain electrode 1515.

40, disposing a pixel definition layer 300 on the array area 120 of the array substrate 100 and the first anode layer 200, wherein the pixel definition layer 300 includes the plurality of holes 310 penetrating the pixel definition layer 300 to expose the first anode layer 200 and the first area 320 disposed on a side of the vacancy area 110.

Figure 11:
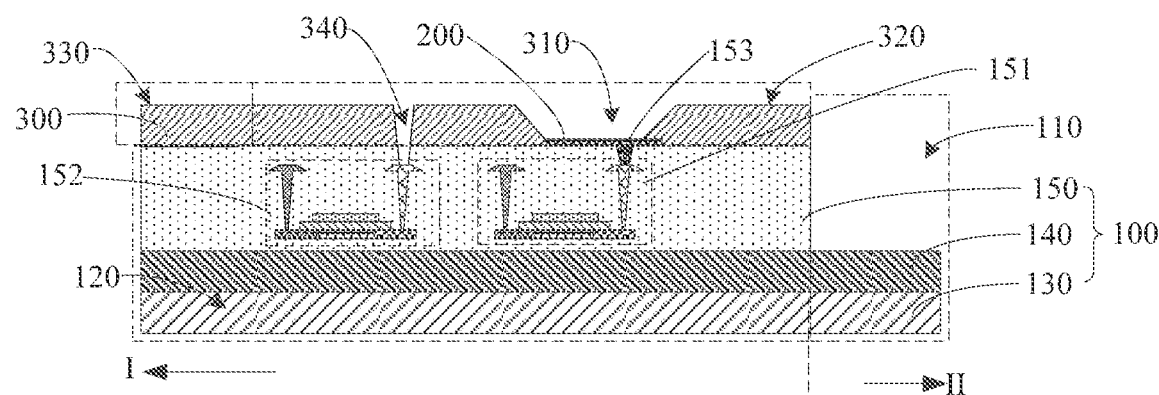

Please refer to FIG. 11, specifically, a pixel definition layer material is disposed on the transistor diode layer 150 and the first anode layer 200, and the pixel definition layer 300 is formed by a photomasking or an etching method. The pixel definition layer 300 includes the plurality of holes 310 and the plurality of via holes 340. The hole 310 and the via hole 230 are disposed in the first area 320. The hole 310 penetrates the pixel definition layer 300 to expose the first anode layer 200. The via hole 340 penetrates the pixel definition layer 300 and the part of the transistor diode layer 150 to expose the second drain electrode 1525. The pixel definition layer 300 includes the first area 320 and the second area 330. The first area 320 is disposed on a side of the vacancy area 110. The first area 320 is disposed between the second area 330 and the vacancy area 110. In the present disclosure, the first area 320 surrounds the vacancy area 110.

50, disposing a second anode layer 400 on the first area 320 of the pixel definition layer 300, and the second anode layer 400 in the plurality of holes 310 is disposed on a surface of the pixel definition layer 300 facing the vacancy area 110, wherein the first anode layer 200 and the second anode layer 400 are insulated from each other.

Figure 12:
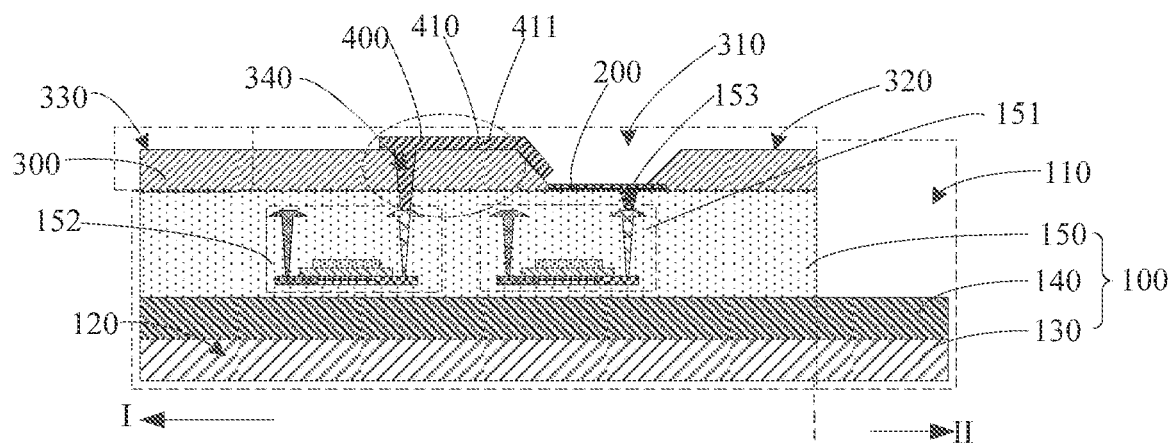

Please refer to FIG. 12, specifically, a second anode layer material is disposed in the via hole 340 and on the first area 320 of the pixel definition layer 300, and the second anode layer 400 is formed by photomasking or etching. The second anode layer 400 includes the plurality of first anodes 410. Each of the plurality of first anodes 410 includes the extension portion 411. The extension portion 411 is disposed on the upper surface of the pixel definition layer 300, and disposed in the via hole 340. The first anode 410 is electrically connected to the second drain electrode 1525 by the extension portion 411.

Figure 13:
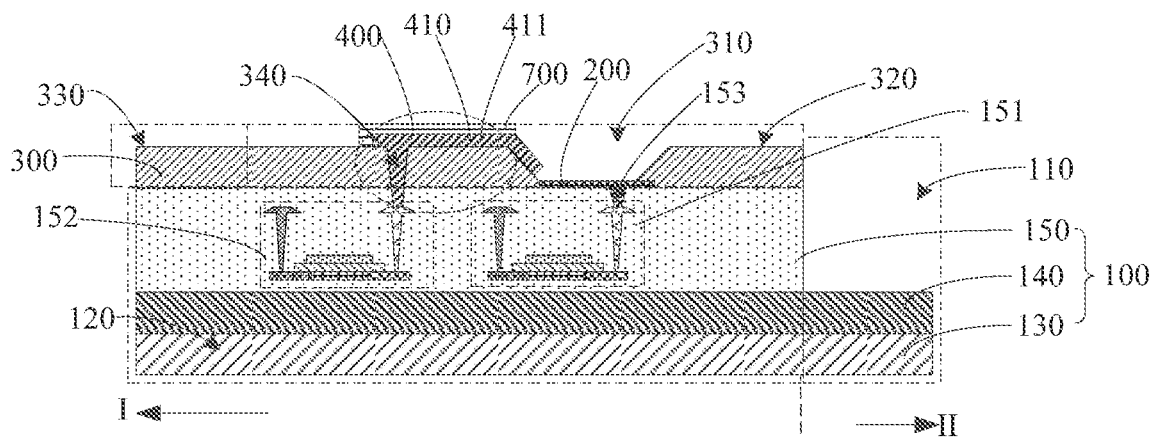

Please refer to FIG. 13, after the step of disposing a second anode layer 400 on the first area 320 of the pixel definition layer 300, disposing the insulation layer 700 on the extension portion 411 to cover the extension portion 411.

In the present disclosure, the insulation layer 700 is disposed on the second anode layer 400 to isolate the second anode layer 400 and the cathode layer 600, and to prevent electrical short circuits.

60, disposing the light-emitting layer 500 including the plurality of light-emitting portions 510 in the plurality of holes 310, wherein each of the plurality of light-emitting portions 510 is disposed in one of the plurality of holes, and the plurality of light-emitting portions 510 cover and electrically connect the first anode layer 200 and the second anode layer 400.

Figure 14:
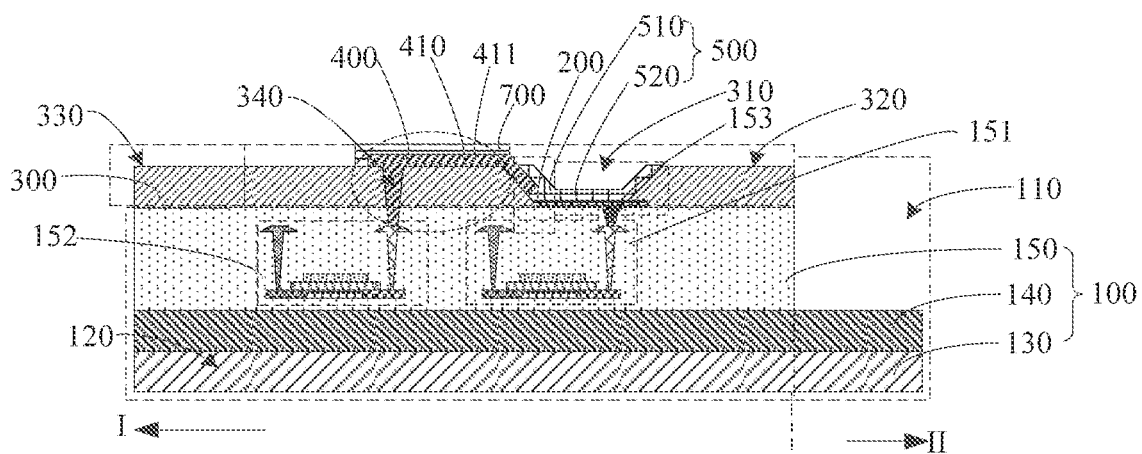

Please refer to FIG. 14, specifically, the light-emitting layer 500 is formed in the hole 310 by photomasking. The light-emitting layer 500 includes the plurality of first light-emitting portions 510 and the plurality of second light-emitting portions 520. The first light-emitting portions 510 are electrically connected to the second light-emitting portions 520. The first light-emitting portions 510 are electrically connected to the first anode layer 200 and the second anode layer 500. The first light-emitting portions 510 cover and are electrically connected to the second anode layer 400. Light emitted by the first light-emitting portion 510 is emitted from the vacancy area 110. The light emitted by the first light-emitting portion 510 is emitted sideways. The second light-emitting portions 520 cover and are electrically connected to the first anode layer 200. Light emitted by the second light-emitting portion 520 is emitted from the array area 120. The light emitted by the second light-emitting portion 520 is vertically emitted light. The first light-emitting portion 510 is electrically connected to the second light-emitting portion 520. The first light-emitting portion 510 and the second light-emitting portion 520 include a red light-emitting portion, a green light-emitting portion, and a blue light-emitting portion.

70, disposing the cathode layer 600 on the pixel definition layer 300 and the light-emitting layer 500, wherein the cathode layer 600 is electrically connected to the light-emitting layer 500.

Figure 15:
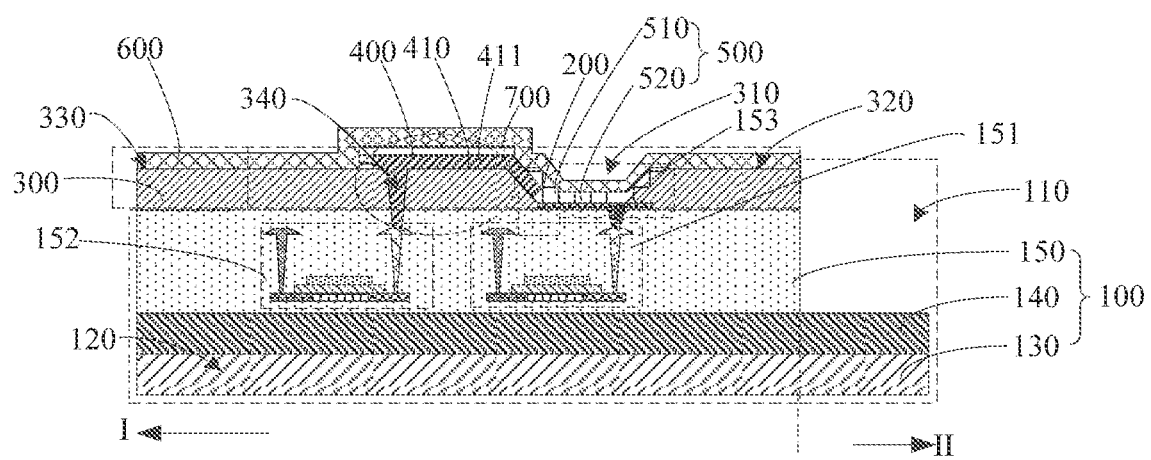

Please refer to FIG. 15, specifically, the cathode layer 600 is formed on the pixel definition layer 300, the insulation layer 700, and the light-emitting layer 500 by photomasking or etching.

In the present disclosure, the second light-emitting portion is electrically connected to the first anode layer and the cathode layer. The first transistors drive the second light-emitting portions. Light emitted by the second light-emitting portion is vertically emitted light, and configured to provide normal display of an area surrounding the vacancy area. The first light-emitting portion is electrically connected to the second anode layer and the cathode layer. The second transistor is electrically connected to the second anode layer. The second transistor drives the first light-emitting portion. The first light-emitting portion emits light sideways to provide the light required for imaging of the under-screen camera disposed in the vacancy area, and to allow the vacancy area to display normally. At the same time, it further ensures that the under-screen camera can capture enough external light for normal imaging, because a functional film layer of the vacancy area is removed.

Figure 16:
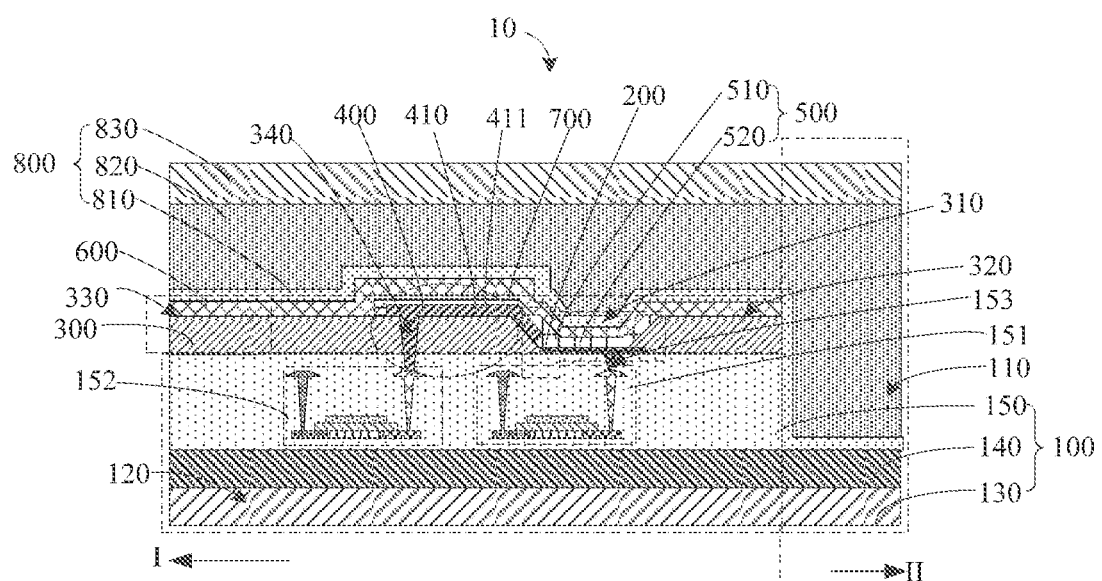

Please refer to FIG. 16, after the step of disposing the cathode layer 600 on the pixel definition layer 300 and the light-emitting layer 500, the method further includes sequentially stacking the first inorganic layer 810, the organic layer 820, and the second inorganic layer 830 on the array substrate 100 and the cathode layer 600 disposed on the array area 120. The first inorganic layer 810, the organic layer 820, and the second inorganic layer 830 constitute the encapsulation layer 800 of the display panel 10. In the present embodiment, the encapsulation layer 800 is a three-layer laminated structure.

The present disclosure provides the display panel and the manufacturing method thereof. The display panel includes the array substrate, the first anode layer, the pixel definition layer, the second anode layer, the light-emitting layer, and the cathode layer. The array substrate includes the array area and the vacancy area. The first anode layer is disposed on the array area and electrically connected to the array substrate. The pixel definition layer is disposed on the array area of the array substrate and the first anode layer, and includes the plurality of holes penetrating the pixel definition layer to expose the first anode layer and a first area disposed on a side of the vacancy area. The second anode layer is disposed on the first area of the pixel definition layer, and the second anode layer in the plurality of holes is disposed on a surface of the pixel definition layer facing the vacancy area, wherein the first anode layer and the second anode layer are insulated from each other. The light-emitting layer including the plurality of light-emitting portions, wherein each of the plurality of light-emitting portions is disposed in one of the plurality of holes, and the plurality of light-emitting portions cover and electrically connect the first anode layer and the second anode layer. The cathode layer is disposed on the pixel definition layer and the light-emitting layer, and electrically connected to the light-emitting layer. In the present disclosure, the first light-emitting portion emits the light sideways to the vacancy area by connecting the first light-emitting portion with the second anode layer, which allows the vacancy area to image normally and display normally.

The above description is only used to explain certain embodiments of the present disclosure, but is not intended to limit the patent scope of the present disclosure. All equivalent structures or equivalent flow transformations based on the contents in the specification and accompanying drawings of the present disclosure, or direct or indirect applications to other relevant technical fields should also fall within the patent protection scope of the present disclosure.

What is claimed is:
1. A display panel, comprising:
an array substrate comprising an array area and a vacancy area, and comprising a substrate and a buffer layer disposed on the substrate;
a first anode layer disposed on the array area and electrically connected to the array substrate;

a pixel definition layer disposed on the array area of the array substrate and the first anode layer, wherein the pixel definition layer comprises a plurality of holes penetrating the pixel definition layer to expose the first anode layer, and a first area disposed on a side of the vacancy area;

a second anode layer disposed on the first area of the pixel definition layer, wherein the second anode layer in the plurality of holes is disposed on a surface of the pixel definition layer facing the vacancy area, and the first anode layer and the second anode layer are insulated from each other;

a light-emitting layer comprising a plurality of light-emitting portions, wherein each of the plurality of light-emitting portions is disposed in one of the plurality of holes, and the plurality of light-emitting portions cover and electrically connect the first anode layer and the second anode layer; and a cathode layer disposed on the pixel definition layer and the light-emitting layer, and electrically connected to the light-emitting layer.

2. The display panel as claimed in claim 1, wherein the second anode layer comprises a plurality of first anodes, wherein each of the plurality of first anodes comprises an extension portion disposed on an upper surface of the pixel definition layer, and an insulation layer is disposed between the extension portion and the cathode layer.

3. The display panel as claimed in claim 1, wherein the first area surrounds the vacancy area.

4. The display panel as claimed in claim 1, wherein the array substrate comprises a plurality of first transistors electrically connected to the first anode layer, and a plurality of second transistors electrically connected to the second anode layer.

5. The display panel as claimed in claim 1, wherein the pixel definition layer further comprises a second area, wherein the first area is disposed between the second area and the vacancy area, and the light-emitting layer further comprises a plurality of second light-emitting portions, wherein each of the plurality of second light-emitting portions is disposed in one of the plurality of holes of the first area, and the plurality of second light-emitting portions electrically connect the first anode layer and the cathode layer.

6. The display panel as claimed in claim 5, wherein the plurality of first light-emitting portions cover the second anode layer, and light emitted by the plurality of first light-emitting portions is emitted from the vacancy area, wherein the plurality of second light-emitting portions cover the first anode layer, and light emitted by the plurality of second light-emitting portions is emitted from the array area.

7. The display panel as claimed in claim 1, wherein the display panel further comprises an encapsulation layer disposed on the cathode layer of the array area and the vacancy area.

8. A display panel, comprising:
an array substrate comprising an array area and a vacancy area;
a first anode layer disposed on the array area and electrically connected to the array substrate;
a pixel definition layer disposed on the array area of the array substrate and the first anode layer, wherein the pixel definition layer comprises a plurality of holes penetrating the pixel definition layer to expose the first anode layer, and a first area disposed on a side of the vacancy area;

a second anode layer disposed on the first area of the pixel definition layer, wherein the second anode layer in the plurality of holes is disposed on a surface of the pixel definition layer facing the vacancy area, and the first anode layer and the second anode layer are insulated from each other;

a light-emitting layer comprising a plurality of light-emitting portions, wherein each of the plurality of light-emitting portions is disposed in one of the plurality of holes, and the plurality of light-emitting portions cover and electrically connect the first anode layer and the second anode layer; and a cathode layer disposed on the pixel definition layer and the light-emitting layer, and electrically connected to the light-emitting layer.

9. The display panel as claimed in claim 8, wherein the second anode layer comprises a plurality of first anodes, wherein each of the plurality of first anodes comprises an extension portion disposed on an upper surface of the pixel definition layer, and an insulation layer is disposed between the extension portion and the cathode layer.

10. The display panel as claimed in claim 8, wherein the first area surrounds the vacancy area.

11. The display panel as claimed in claim 8, wherein the array substrate comprises a plurality of first transistors electrically connected to the first anode layer, and a plurality of second transistors electrically connected to the second anode layer.

12. The display panel as claimed in claim 8, wherein the pixel definition layer further comprises a second area, wherein the first area is disposed between the second area and the vacancy area, and the light-emitting layer further comprises a plurality of second light-emitting portions, wherein each of the plurality of second light-emitting portions is disposed in one of the plurality of holes of the first area, and the plurality of second light-emitting portions electrically connect the first anode layer and the cathode layer.

13. The display panel as claimed in claim 12, wherein the plurality of first light-emitting portions cover the second anode layer, and light emitted by the plurality of first light-emitting portions is emitted from the vacancy area, wherein the plurality of second light-emitting portions cover the first anode layer, and light emitted by the plurality of second light-emitting portions is emitted from the array area.

14. The display panel as claimed in claim 8, wherein the display panel further comprises an encapsulation layer disposed on the cathode layer of the array area and the vacancy area.

15. A manufacturing method of a display panel, comprising following steps:
providing an array substrate comprising an array area and a vacancy area;
disposing a first anode layer on the array area of the array substrate, wherein the first anode layer is electrically connected to the array substrate;
disposing a pixel definition layer on the array area of the array substrate and the first anode layer, wherein the pixel definition layer comprises a plurality of holes penetrating the pixel definition layer to expose the first anode layer and a first area disposed on a side of the vacancy area;
disposing a second anode layer on the first area of the pixel definition layer, wherein the second anode layer in the plurality of holes is disposed on a surface of the pixel definition layer facing the vacancy area, and the first anode layer and the second anode layer are insulated from each other;

disposing a light-emitting layer comprising a plurality of light-emitting portions in the plurality of holes, wherein each of the plurality of light-emitting portions is disposed in one of the plurality of holes, and the plurality of light-emitting portions cover and electrically connect the first anode layer and the second anode layer; and disposing a cathode layer on the pixel definition layer and the light-emitting layer, wherein the cathode layer is electrically connected to the light-emitting layer.

16. The manufacturing method of the display panel as claimed in claim 15, wherein after the step of disposing the cathode layer on the pixel definition layer and the light-emitting layer, wherein the cathode layer is electrically connected to the light-emitting layer, the manufacturing method of the display panel further comprises:

disposing an encapsulation layer on the cathode layer of the array area and the vacancy area.

17. The manufacturing method of the display panel as claimed in claim 15, wherein after the step of disposing the second anode layer on the first area of the pixel definition layer, wherein the second anode layer in the plurality of holes is disposed on a surface of the pixel definition layer facing the vacancy area, and the first anode layer and the second anode layer are insulated from each other, the manufacturing method of the display panel further comprises:

disposing an insulation layer on the second anode layer, wherein the second anode layer comprises a plurality of first anodes, and each of the plurality of second anodes comprises an extension portion disposed on an upper surface of the pixel definition layer, and the insulation layer covers the extension portion.

* * * * *